United States Patent
Moons et al.

(10) Patent No.: US 7,042,284 B2
(45) Date of Patent: May 9, 2006

(54) OPERATIONAL AMPLIFIER ARRANGEMENT

(75) Inventors: Elvé Desiderius Jozef Moons, Lummen (BE); Joannes Mathilda Josephus Sevenhans, Brasschaat (BE)

(73) Assignee: Alcatel, Paris (FR)

( * ) Notice: Subject to any disclaimer, the term of this patent is extended or adjusted under 35 U.S.C. 154(b) by 44 days.

(21) Appl. No.: 10/664,856

(22) Filed: Sep. 22, 2003

(65) Prior Publication Data
US 2004/0056713 A1  Mar. 25, 2004

(30) Foreign Application Priority Data
Sep. 20, 2002  (EP) .................................. 02292307

(51) Int. Cl.
*H03F 3/45* (2006.01)
(52) U.S. Cl. ....................... 330/69; 330/85; 330/124 R
(58) Field of Classification Search ...................... None
See application file for complete search history.

(56) References Cited

U.S. PATENT DOCUMENTS

| | | | |
|---|---|---|---|
| 5,374,966 A * | 12/1994 | Weigand ................ | 330/124 R |
| 5,438,684 A | 8/1995 | Schwent et al. | |
| 6,028,485 A | 2/2000 | Sigmon et al. | |
| 6,300,828 B1 * | 10/2001 | McInnis ................ | 330/124 R |

FOREIGN PATENT DOCUMENTS

| | | |
|---|---|---|
| DE | 100 54 540 A1 | 6/2002 |
| EP | 1 024 591 A1 | 8/2000 |
| EP | 1 024 592 A1 | 8/2000 |
| EP | 1 220 442 A1 | 7/2002 |
| EP | 1 220 443 A1 | 7/2002 |
| EP | 1 229 641 A1 | 8/2002 |

* cited by examiner

*Primary Examiner*—Khanh V. Nguyen
(74) *Attorney, Agent, or Firm*—Sughrue Mion, PLLC

(57) ABSTRACT

An operational amplifier arrangement having a non-linear amplifier and a linear amplifier, both having a pair of input terminals one of which is coupled to an arrangement input terminal, and both having an output terminal that is coupled to an arrangement output terminal. The output terminal of the non-linear amplifier is further coupled to the output terminal of the linear amplifier via a series impedance. The output terminal of the linear amplifier is coupled to the arrangement output terminal via a terminating impedance. The arrangement includes an active back termination arrangement coupled between the arrangement output terminal and either one of the pair of input terminals of the linear amplifier. Preferably, the linear amplifier is receiving a supply voltage that exceeds the supply voltage received by the non-linear amplifier.

13 Claims, 6 Drawing Sheets

OPERATIONAL AMPLIFIER ARRANGEMENT

BACKGROUND OF THE INVENTION

The present invention relates to an operational amplifier arrangement, and more particularly operational amplifier arrangements which can be used as line drivers in telecommunication line circuits.

Line driver circuits are already known in the art and comprise the classical class-G-based operational amplifiers such as these for instance described in published European Patent Applications 1 024 592 and 1 024 591. Other line driver circuits are based on switching line drivers such as the one described in the published European Patent Application 1 229 641. Yet other types of line drivers are based on class C-AB architectures, such as these disclosed in published European Patent application 1 220 442 and 1 220 443. Key issues for line drivers in applications such as ADSL, which is the abbreviation of asymmetric digital subscriber line, are the power efficiency, the linearity and the complexity. Although all types of above-mentioned line drivers were conceived such as to optimize these issues, yet there remains a need for improvement of the power efficiency, and linearity, while at the same time keeping the complexity of the operational arrangement as low as possible. This is especially important for very high speed digital subscriber line applications, hereafter abbreviated with VDSL.

SUMMARY OF THE INVENTION

An aspect of the present invention is thus to provide an operational amplifier arrangement which is power efficient, linear and simple.

In this way, a new operational amplifier arrangement architecture is provided having a very good linearity, which is simple and which is very power efficient. Its operation will be described into detail in the descriptive part of this document, but can be summarized briefly by stating that the non-linear amplifier drives maximum power to the line with a maximum efficiency, whereby the linear amplifier is correcting the non-linearities caused by this non-linear amplifier, such as cross-over errors, slew rate and other distortions.

Thereby power efficiency is further improved by the fact that said non-linear amplifier is working at a reduced supply voltage, such that it is clipping on the high input signal levels. However, these additional errors are further corrected by means of the linear amplifier which is operative at the highest supply voltage level, and which can thus correct these clipping errors.

Thereby differential embodiments are provided for driving differential signals to two-wire loads. The relationships between corresponding amplifiers, resistors and active back terminating arrangements thereby guarantees further linearity and symmetry of the differential embodiments.

This further improves the power efficiency of the differential embodiment by means of a more pronounced application of the so-called "active back termination" principle. The active back termination principle is thereby exploited to another resistor level, thereby further improving the power efficiency while still keeping the same low complexity and good linearity.

These define additional requirements for operation of the operational amplifier arrangements, which further enables selecting appropriate resistors and amplifiers.

These conditions present further restrictions for the resistors in the different embodiments claimed in case these operational amplifiers need to terminate a series load impedance, such as is the case for a line driver application.

It is to be noticed that the term 'coupled', used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

BRIEF DESCRIPTION OF THE DRAWINGS

The above and other aspects and features of the invention will become more apparent and the invention itself will be best understood by referring to the following description of an embodiment taken in conjunction with the accompanying drawings wherein FIG. 1 gives a schematic of a single-ended embodiment of an operational amplifier arrangement OAA according to the invention, FIG. 2 schematically depicts a first differential embodiment of an operational amplifier arrangement according to the invention.

DESCRIPTION OF THE INVENTION

Figure 1:
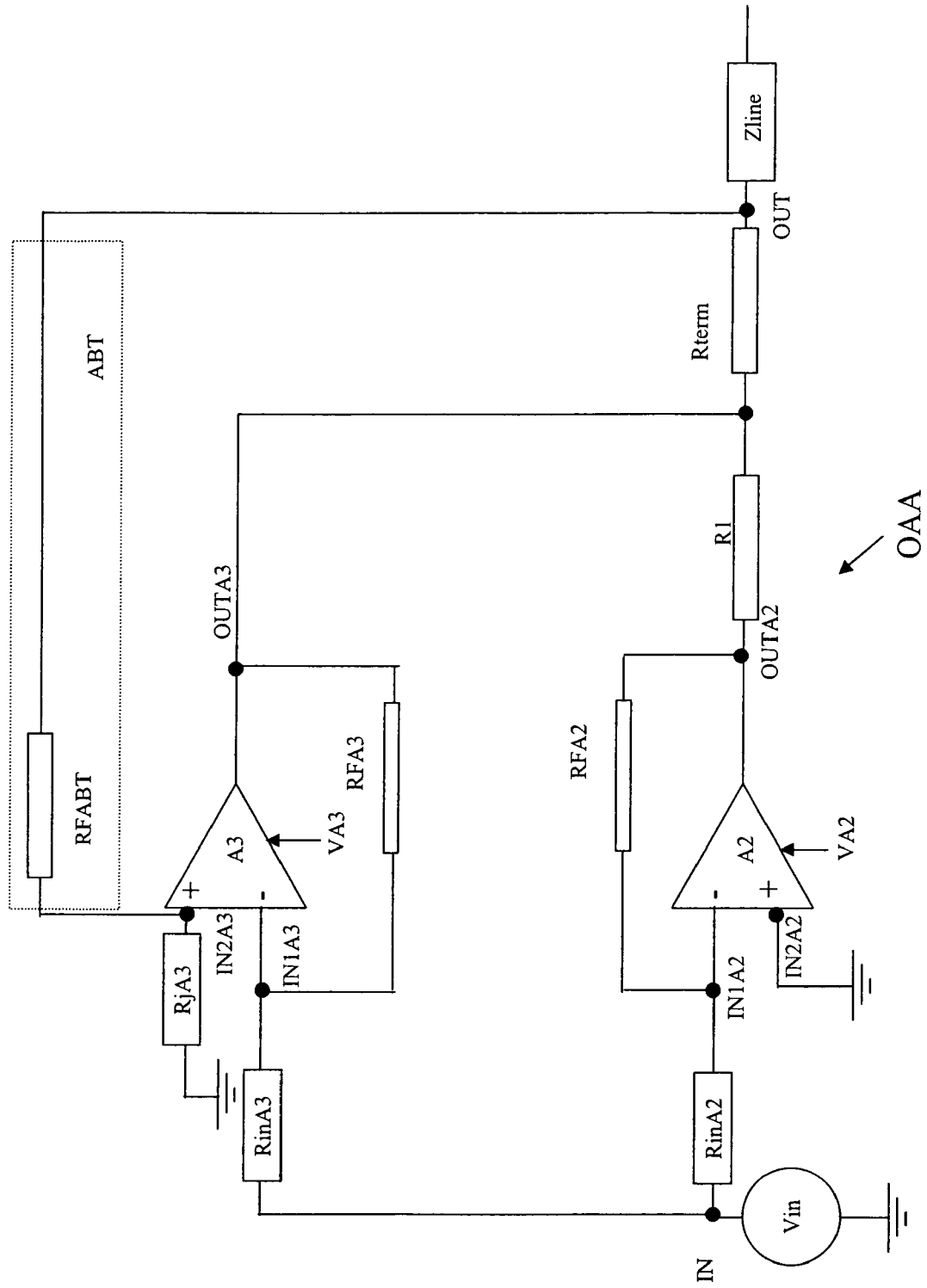

The operational amplifier arrangement OAA depicted in FIG. 1 includes an input terminal IN, an output terminal OUT, and two pairs of supply terminals (not shown on FIG. 1). To this single-ended embodiment is provided an input voltage from a source Vin, for instance being the signal delivered by the D-A converter in ADSL applications. This input terminal is coupled to the respective input terminals of two amplifiers: a non-linear amplifier A2 and a linear amplifier A3. Such a non-linear amplifier may for instance consist of a class-B amplifier as indicated in FIG. 1. However, other types of non-linear amplifiers are possible such as switching mode amplifiers, class C or class D amplifiers. In general, a very power efficient amplifier will be chosen for this non-linear amplifier in this operational amplifier arrangement. For the linear amplifier A3, class A or AB amplifiers can be used. In a preferred embodiment, the non-linear amplifier power supply terminals are coupled to one pair of supply terminals of the operational amplifier arrangement, whereas the linear amplifier has power supply terminals which are coupled to the other pair of supply terminals of the operational amplifier arrangement. The supply voltage VA3 of the linear amplifier is thereby higher in amplitude than the supply voltage VA2 of the non-linear amplifier. A consequence of this is that high input signals will be clipping to the lower supply voltage levels of the non-linear amplifier, whereas these can yet be amplified nicely by the linear amplifier operating between supply rails of a higher voltage. However, in other embodiments both linear and non-linear amplifiers are operative between the highest supply voltage. Power efficiency of the arrangement is nevertheless improved for the preferred embodiment whereby the non-linear amplifier operates at a lower supply voltage than the linear amplifier.

The non-linear amplifier A2 has an output terminal OUT A2, and has a first feedback impedance RFA2 coupled between this output terminal OUTA2 and an input terminal IN1A2. Another input terminal IN2A2 of this amplifier is coupled to the ground reference in this single-ended embodiment. The input voltage may be reduced by means of an input resistor RinA2 coupled between the input terminal IN of the arrangement and the first terminal IN1A2.

Similarly, another input resistor RINA3 may be placed in the input path of the linear amplifier A3, thus between the arrangement input terminal IN and a first input terminal IN1A3 of the linear amplifier A3. This linear amplifier similarly has a second input terminal IN2A3, coupled to the ground reference. The output terminal OUTA3 of the linear amplifier is further coupled via a second feedback impedance RFA3, to the first input terminal IN1A3, and also to the output terminal OUTA2 of the non-linear amplifier, by means of an output series impedance R1. OUTA3 is also coupled to the arrangement output terminal OUT, via a terminating impedance Rterm.

The operational amplifier arrangement OAA further includes an active back termination arrangement, which, in the embodiment depicted in FIG. 1 simply consists of a feedforward impedance RFABT, coupled between the arrangement output terminal OUT and the second input terminal IN2A3. In another embodiment, this active back termination arrangement may consist of an inverter in series with a similar feedforward impedance, both of which are coupled in series between the arrangement output terminal OUT and the first input terminal IN1A3 of the linear amplifier A3.

This feedforward coupling realized by the active back termination arrangement is crucial in the operation of the amplifier arrangement OAA since in this way distorted signals coming from the non-linear amplifier A2, are thereby fed back to an input of the linear amplifier A3. This linear amplifier thereby amplifies them, but due to the inversion operation of the active back termination also subtracts them from the total signal as appearing on the summing nodes OUTA3 and OUT. The distorted signal from the non-linear amplifier is thus again corrected by means of the linear amplifier.

It is thereby also mandatory that the gain which is provided by the non-linear amplifier part between IN and OUT, thus including RINA2, A2, RFA2, R1 and Rterm equals the gain which is provided by the linear amplifier part between IN and OUT, including RINA3, A3, RFA3, RjA3, RFABT and RTERM. Furthermore, it is also mandatory that the part of the output impedance of the arrangement, seen from the output terminal, with only RTERM, A3, RFA3, RFABT concerned, has to be the same as the part of the output impedance of the arrangement, also seen from the output terminal, but with only RTERM, R1, A2 and RFA2 concerned. The philosophy behind both requirements is that the operational amplifier arrangement comprises two equivalent paths in parallel of which the possible distortions caused by the non-linear amplifier are corrected by means of the linear one.

Figure 6:
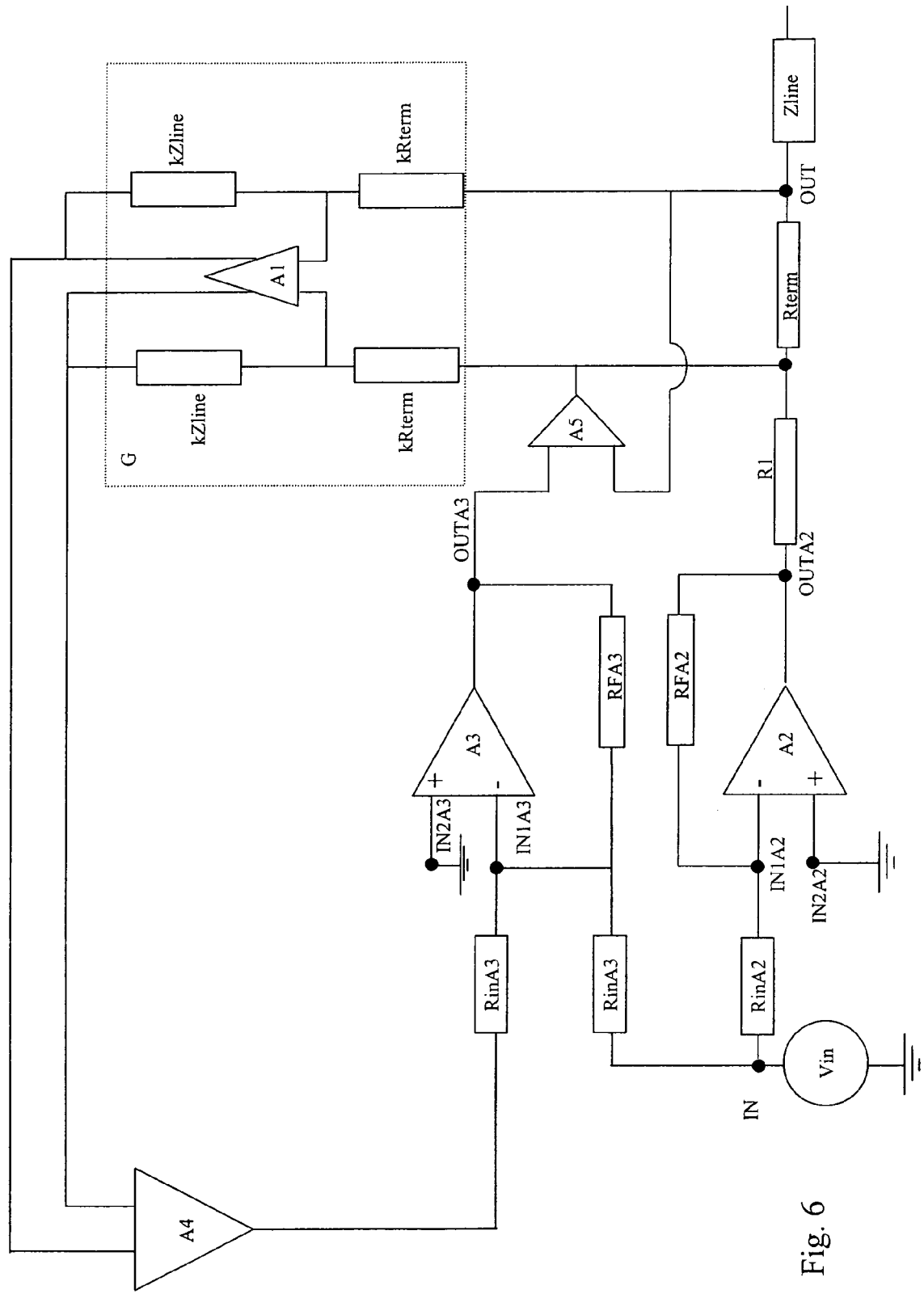

The principle of operation of the active back termination arrangement of this embodiment is made clear by means of the equivalent scheme, which is depicted in FIG. 6. Following equations hold:

$$Zline = R1 + Rterm \quad (1),$$

since Zline which, in FIG. 6 and in FIG. 1, corresponds to the load impedance, has to be equal to the output impedance Zout for appropriately terminating the amplifier arrangement to the line impedance as is mandatory in order to avoid reflections.

Furthermore, $$VoutA3 = (Vin - (Zout/G).Iout.G).A3 \quad (2)$$

whereby G is the gain of the block comprising of amplifier A1, and impedances k.Rterm, and k.Zline, depicted by means of their resistance values, and A3 here depicts the gain of the linear amplifier A3 and its input resistors and feedback resistors.

Since Zout/G equals Rterm, this equation means that the voltage across Rterm, being Iout.Rterm, multiplied by the gain of the block G appears at the input of A3, whereby it is subtracted from the input Vin.

Equation (2) can be further reduced to:

$$VoutA3 = (Vin - Iout \times Zout).A3 \quad (3)$$

By means of the presence of amplifier A5

$$Vout = VoutA3 \quad (4)$$

Such that $$Vout = (Vin - Iout \times Zout).A3 \quad (5)$$

Equation (5) thus gives the basis for the synthesis of Zout, which needs to be equal to the load impedance, corresponding to the line impedance Zline, in the case of a line driver. This is performed by the Active back termination arrangement, which, in a very simple embodiment can merely comprise of one resistor coupled between the arrangement output terminal and an input terminal of the linear amplifier, as was already described for the embodiment of FIG. 1.

In the scheme depicted in FIG. 6, all amplifiers are inverting amplifiers. This is the reason why an additional inversion, denoted by A4, is to be further included such as to obtain the correct equations. Remark also that the added resistor RinA3 was needed such as to accomplish the summing operation, whereby in the equivalent scheme of FIG. 6 the positive input is kept to the ground reference since the feedback from the output was fed to the same input terminal to which the input signal was supplied. In the scheme of FIG. 1, the feedback from the output signal on the output terminal OUT was fed to the other input terminal of A3. The presence of amplifier A5 in this equivalent scheme thereby forces the voltage VoutA3 to be equal to the output voltage Vout.

Figure 2:
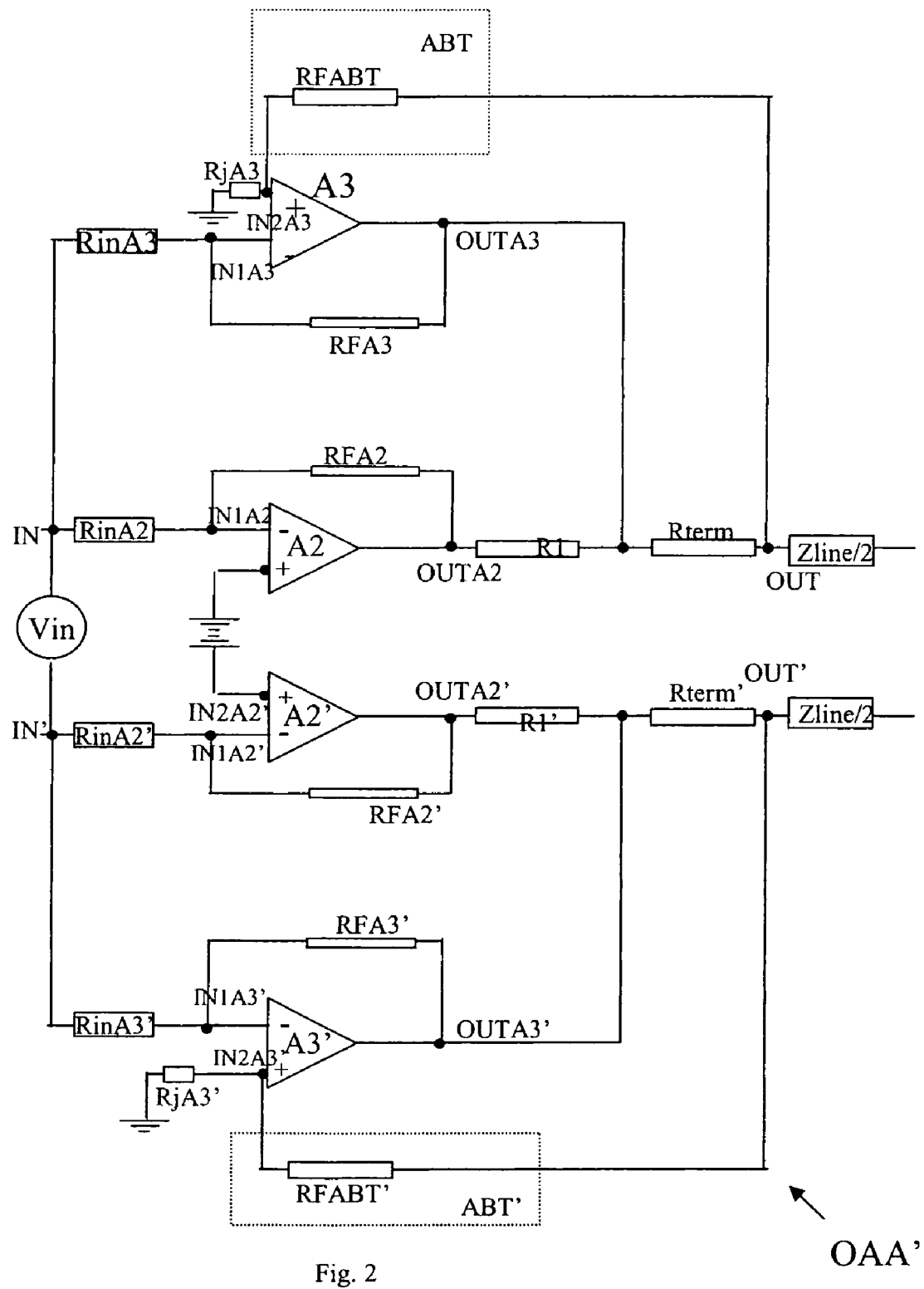

Other embodiments of an operational amplifier according to the invention are depicted in FIGS. 2 to 5. In FIG. 2, a differential embodiment OAA', including two halves, each of which is similar to the embodiment depicted in FIG. 1, is shown. The first half, coupled to input terminal IN, includes a non-linear amplifier A2, possibly operating at a lower supply voltage than a linear amplifier A3. The linear amplifier has input resistors RinA3, RjA3, and a feedback resistor RFA3, whereas the non-linear amplifier A2 of the first branch includes has input resistor RinA2, feedback resistor RFA2. The output terminal OUTA2 of the non-linear amplifier A2 is coupled via a series impedance R1 to the output terminal OUTA3 of the linear amplifier A3. A terminating impedance Rterm is coupled between OUTA3 and a first arrangement output terminal OUT, whereby this first arrangement output terminal is coupled via an active back termination arrangement, in the embodiment depicted in FIG. 2 simply comprising of a resistor RFABT, is coupled to an input terminal IN2A3 of the linear amplifier A3.

Similarly, the other half, with input terminal IN', includes as well a linear amplifier A3' and a non-linear amplifier A2'. Linear amplifier A3' has input resistors RinA3' and RjA3', and a feedback resistance RFA3'. Non-linear amplifier A2' has input resistor RinA2', and feedback resistor RFA2'. The single output of A2', denoted OUTA2' is coupled via a second series impedance R1' to the output terminal OUTA3' of A3'. A second terminating impedance Rterm' is coupled between OUTA3' and the second arrangement output terminal OUT', whereas this second arrangement output terminal is coupled to an input terminal of the linear amplifier A3' via a second active back termination arrangement ABT', in the embodiment depicted in FIG. 2 simply comprising of an impedance RFABT' coupled between OUT' and IN2A3'.

For stability, symmetry and linearity reasons both halves are realized using substantially equal devices. Thus A2 and A2' are chosen as similar amplifiers, as well as A3 and A3' whereby also the respective input and feedback impedances of the corresponding amplifiers have substantially equal values. Series impedances R1 and R1' are similar as well as, terminating impedances Rterm and Rterm' and active back terminating impedances RFABT and RFABT'.

Because of the differentiality, the load impedances in both halves may also be halved with respect to the load impedance in the single ended embodiment. This is the reason why these are depicted by a load impedance denoted Zline/2 in FIG. 2.

Figure 3:
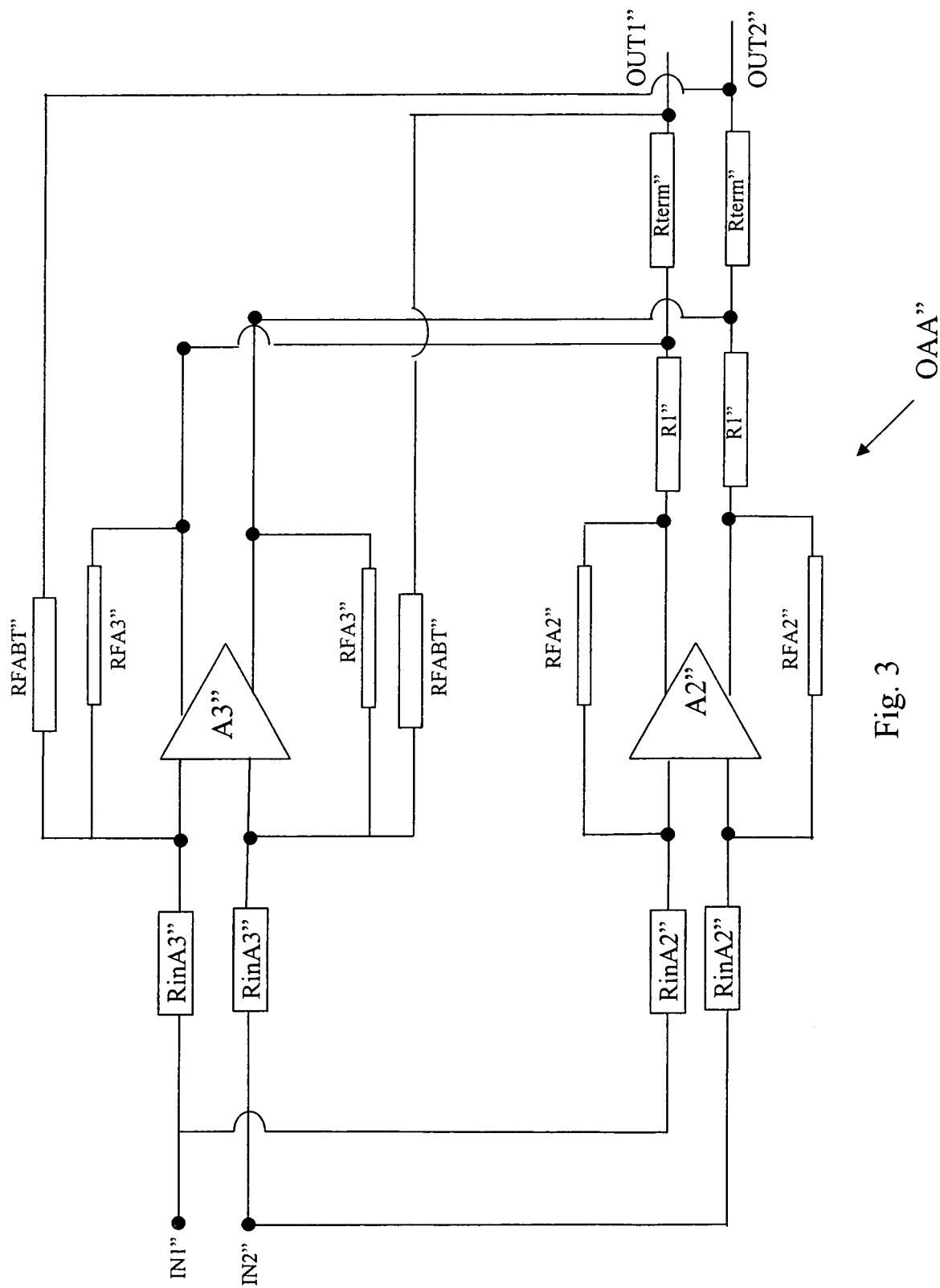
FIG. 3 depicts another differential embodiment of an operational amplifier arrangement according to the invention.

The differential operational amplifier arrangement OAA" depicted in FIG. 3 also includes two arrangement input terminals IN1" and IN2", as well as two arrangement output terminals OUT1" and OUT2", but only includes one amplifier of each type, namely a linear amplifier A3", again operating between the highest supply voltage rails, and a non-linear amplifier A2" possibly operating at a lower supply voltage.

Both linear and non-linear amplifiers have two input terminals and two output terminals, respectively coupled to the two arrangement input terminals and the two arrangement output terminals as can be observed from FIG. 3. The arrangement input terminals are thereby coupled to the linear amplifier input terminals via two respective input resistors, both denoted RinA3" which are also substantially equal because of stability. Similarly, two substantially equal input resistors, both denoted RinA2" are coupled between arrangement input terminals and respective non-linear amplifier input terminals. A3" has two similar feedback impedances, both denoted RFA3". The same holds for A2" having also two similar feedback impedances both denoted RFA2" because they have substantially equal values. Output terminals of A2" are coupled to corresponding output terminals of A3" via respective series impedances, both denoted R1" because they are similar. With corresponding output terminals is meant that both output terminals of these amplifiers are delivering the same sign of signal at a moment in time. In other words, the positive output terminal of A2" is coupled to the positive output terminal of A3" and vice versa.

The output terminals of A3" are further coupled to the corresponding arrangement output terminals OUT1" and OUT2" via respective terminating impedances, both denoted Rterm" since these are also similar for symmetry reasons. In the embodiment depicted in FIG. 3, these arrangement output terminals are coupled to the non-corresponding input terminals of the linear amplifiers via respective active back terminating arrangements, in the embodiment depicted in FIG. 3 merely comprising of resistors. In other embodiments however these active back terminating arrangements may again comprise of a series coupling of a resistor and an invertor, in which case arrangement output terminals are connected via this type of active back terminating arrangements, to the corresponding input terminals of the linear amplifier A3".

Figure 4:
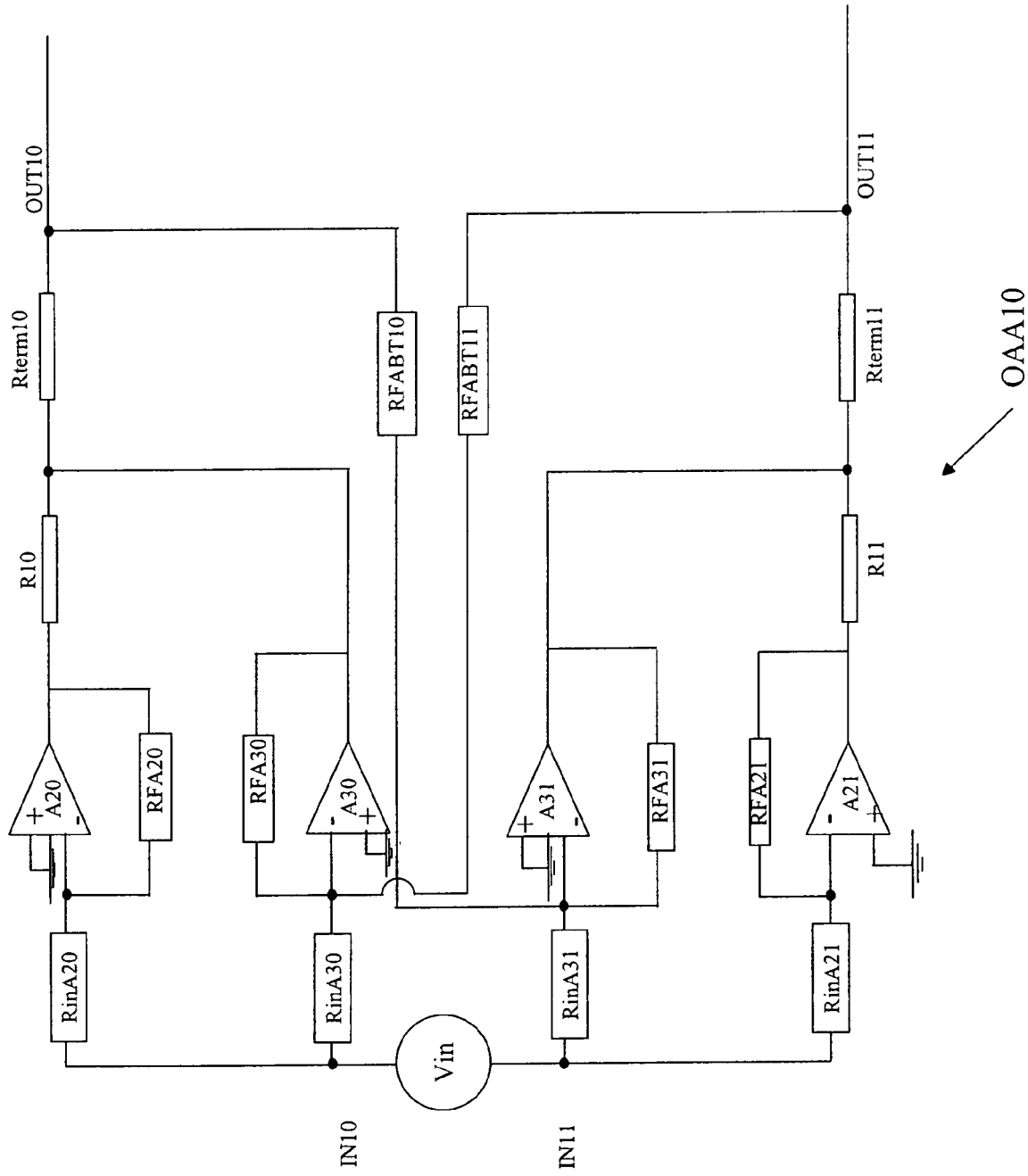
FIG. 4 depicts a third differential embodiment of an operational amplifier arrangement according to the invention.

Yet another differential embodiment, OAA10, which shows a lot of resemblance with the one depicted in FIG. 2, is shown in FIG. 4. It again comprises of two halves: a first one comprising of a first parallel branch including non-linear amplifier A20, series impedance RIO and terminating impedance Rterm10, and a second parallel branch with linear amplifier A30 and the same terminating impedance Rterm10. Both amplifiers may further have feedback such as depicted by RFA20 and RFA30 respectively, as well as input resistance respectively depicted by RinA20 and RinA30.

The second half of the embodiment of FIG. 4 again comprises of two parallel branches: a first one via linear amplifier A31 and a second terminating impedance denoted Rterm11, and a second one via non-linear amplifier A21, series impedance R11 and terminating impedance Rterm11. As in the first half, the respective amplifiers may have respective input resistors, respectively denoted RinA31 and RinA21, as well as feedback, respectively denoted by RFA31 and RFA21.

The difference with respect to the embodiment depicted in FIG. 2 lies in the coupling of the active back termination arrangements between the arrangement output terminals and the input terminals of the linear amplifiers. As can be easily observed by comparing both figures, active back terminating resistor RFABT10 is coupled between an arrangement output terminal belonging to one upper half of the arrangement, and an input terminal of the linear amplifier belonging to the lower half of the arrangement. Similarly, active back terminating resistor RFABT11 is coupled between an arrangement output terminal of the lower half to an input terminal of the linear amplifier of the upper half. This embodiment merely presents an alternative embodiment for realizing the active back termination, as compared to the embodiment of FIG. 2.

Figure 5:
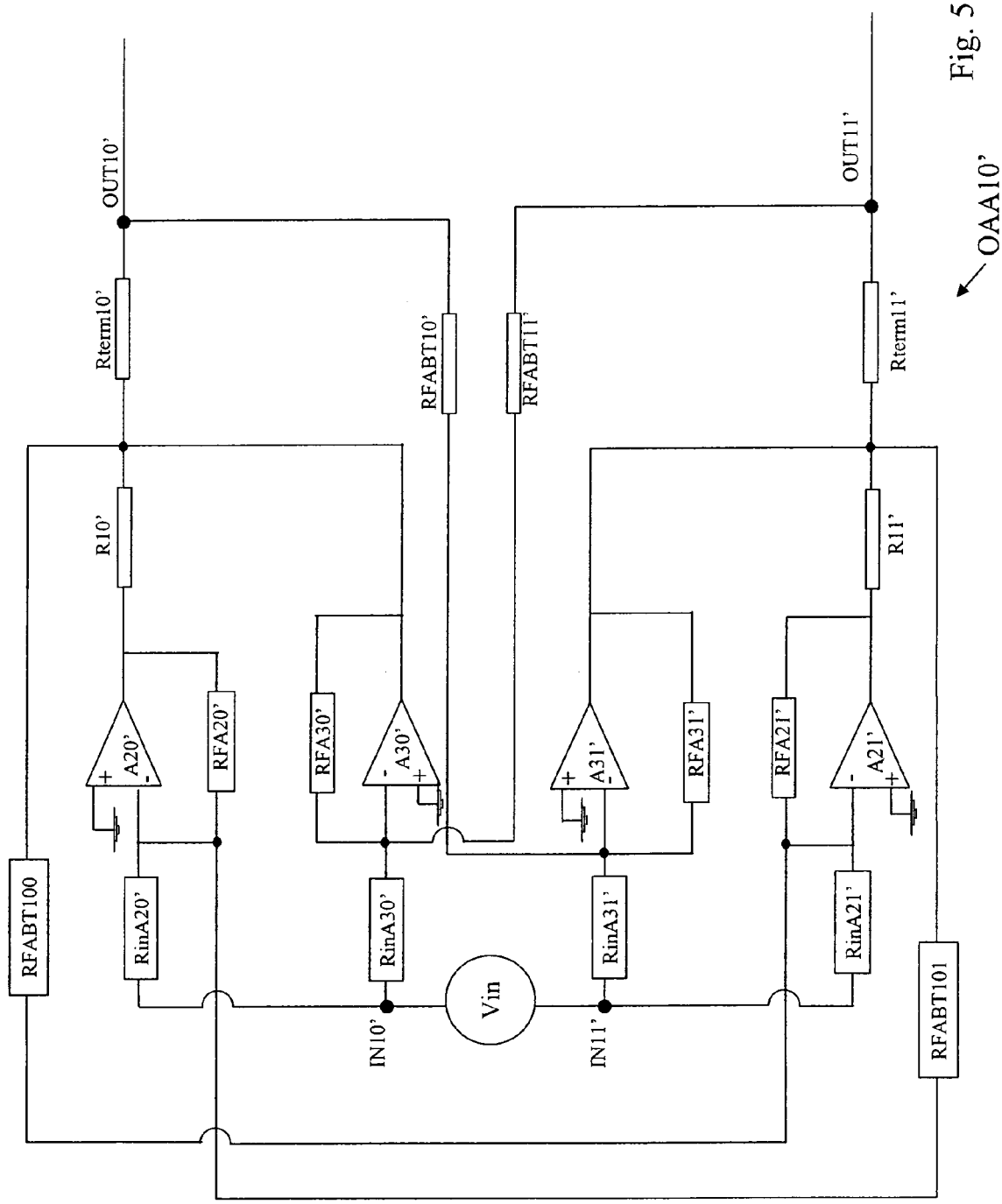
FIG. 5 depicts a fourth differential embodiment of an operational amplifier arrangement according to the invention, and FIG. 6 gives an equivalent schematic, depicting the principal operation of the embodiment of FIG. 1 and the embodiments of FIGS. 2 to 4, according to the invention.

The embodiment depicted in FIG. 5 is basically similar to the one depicted in FIG. 4, except for the addition of another pair of active back terminating arrangements, in the embodiment of FIG. 5 comprising of resistors RFABT100 and RFABT101 respectively. This second pair of active back terminating resistors is thereby cross-coupled between an output terminal of a linear amplifier of one half of the arrangement, to an input terminal of a non-linear amplifier of the other half of the arrangement. Thus, in FIG. 5, output terminal of A31' is coupled to input terminal of A20' via active back terminating resistor RFABT101 while output terminal of A30' is coupled to input terminal of A21' via active back terminating resistor RFABT100. The presence of a second pair of active back termination resistors even improves the power effectiveness of the arrangement since this allows to select the series resistances R10' and R11' to be lower compared to the configuration of FIG. 2. In this case equivalent scheme of FIG. 6 and according formula's are no longer valid. However, the total output impedance of the arrangement OAA10' still needs to be the same to the load impedance.

In FIG. 5, the second active back termination is realized by means of cross-coupling. However in an alternative embodiment the output of the linear amplifier A31 can also be coupled, via a single resistor, to the "+" input of A21', or via a series connection of a single resistor and an inverter to the "−" input of A21' for the embodiment depicted in FIG. 5. Similar considerations hold for the active back termination in the upper half of the scheme.

While the principles of the invention have been described above in connection with specific apparatus, it is to be clearly understood that this description is made only by way of example and not as a limitation on the scope of the invention, as defined in the appended claims.

The invention claimed is:

1. An operational amplifier arrangement comprising a first arrangement input terminal to which an input signal is supplied and a first arrangement output terminal, said operational amplifier arrangement further comprising:
   a non-linear amplifier having a pair of input terminals, one of which is coupled to said first arrangement input terminal, said non-linear amplifier further comprising an output terminal,
   a linear amplifier having a pair of input terminals, one of which is coupled to said first arrangement input terminal, said linear amplifier further comprising an output terminal,
   whereby the output terminal of said non-linear amplifier is coupled to the output terminal of said linear amplifier via a first series impedance,
   whereby the output terminal of said linear amplifier is coupled to the first arrangement output terminal via a first terminating impedance,
   and whereby the operational amplifier arrangement further comprises a first active back termination arrangement coupled between the first arrangement output terminal and either one of said pair of input terminals of said linear amplifier.

2. The operational amplifier arrangement according to claim 1, wherein said non-linear amplifier receives a first supply voltage from a first power supply, while said linear amplifier receives a second supply voltage from a second power supply, wherein the second supply voltage is greater than the first supply voltage.

3. The operational amplifier arrangement according to claim 1, wherein operational amplifier arrangement further comprises a second arrangement input terminal and a second arrangement output terminal, said input signal being a differential input signal applied between said first arrangement input terminal and said second arrangement input terminal, said non-linear amplifier comprising a second output terminal coupled to said second arrangement output terminal via a second series impedance, said linear amplifier comprising a second output terminal coupled to the second arrangement output terminal via a second terminating impedance, said operational amplifier arrangement further comprising a second active back termination arrangement coupled between said second arrangement output terminal and the other one of said pair of input terminals of said linear amplifier.

4. The operational amplifier arrangement according to claim 3, wherein said first series impedance is substantially equal to said second series impedance, said first terminating impedance is substantially equal to said second terminating impedance and said first active back termination arrangement is substantially equal to said second active back termination arrangement.

5. The operational amplifier arrangement according to claim 1, wherein the gain of a first branch between the arrangement input terminal and the arrangement output terminal that comprises said linear amplifier and said first terminating impedance equals the gain of a second branch between the arrangement input terminal and the arrangement output terminal that comprises said non-linear amplifier, said first series impedance and said first terminating impedance.

6. An operational amplifier arrangement comprising a pair of arrangement input terminals and a pair of arrangement output terminals, said operational amplifier arrangement further comprising;
   first and second non-linear amplifiers coupled between said arrangement input terminals and said arrangement output terminals,
   first and second linear amplifiers coupled between said arrangement input terminals and said arrangement output terminals,
   whereby respective output terminals of said non-linear amplifiers are coupled to respective output terminals of said linear amplifiers via respective series impedances,
   whereby respective output terminals of said linear amplifiers are coupled to respective arrangement output terminals via respective terminating impedances,
   and whereby the operational amplifier arrangement further includes a first pair of active back termination arrangements coupled between respective arrangement output terminals and either one of said pair of input terminals of either pair of linear amplifiers.

7. The operational amplifier arrangement according to claim 6, wherein:
   said first and second non-linear amplifiers receive a first power supply voltage, and
   said first and second linear amplifiers receive a second power supply voltage, wherein the second power supply voltage is greater than the first power supply voltage.

8. The operational amplifier according to claim 6, wherein said respective series impedances have substantially equal resistance values, said first and said second non-linear amplifiers are substantially identical, said first and said second linear amplifiers are substantially identical, said respective terminating impedances are substantially identical, and said active back termination arrangements of said first pair of active back termination arrangements are substantially identical.

9. The operational amplifier arrangement according to claim 6, wherein said operational amplifier arrangement comprises a second pair of active back terminating arrangements coupled between the respective output terminals of said first and said second linear amplifiers and either input terminals of either said first or said second linear amplifiers.

10. The operational amplifier arrangement according to claim 9, wherein the active back terminating arrangements of said second pair of active back terminating arrangements are substantially identical.

11. The operational amplifier arrangement according to claim 6, wherein an output impedance between one of said arrangement output terminals and one of said arrangement input terminals via said branch equals an output impedance between said one arrangement output terminal and said one arrangement input terminal via said parallel branch.

12. The operational amplifier arrangement according to claim 6, wherein the sum of said respective series impedances and said respective terminating impedances in series with said respective series impedances is equal to a series load impedance.

13. The operational amplifier arrangement according to claim 9, wherein the sum of said respective series impedances and said respective terminating impedances in series with said respective series impedances is lower than a series load impedance.

* * * * *